United States Patent [19]

Bowles et al.

[11] Patent Number: 5,731,738

[45] Date of Patent: Mar. 24, 1998

[54] METHOD AND MECHANISM OF WEAK PULL-UP FOR USE WITH A MICROCONTROLLER IN AN INTEGRATED CIRCUIT

[75] Inventors: James E. Bowles; Robert O'Brien, both of Austin, Tex.

[73] Assignee: Advanced Micro Devices, Inc., Sunnyvale, Calif.

[21] Appl. No.: 332,430

[22] Filed: Oct. 31, 1994

Related U.S. Application Data

[63] Continuation of Ser. No. 917,488, Jul. 21, 1992, abandoned.

[51] Int. Cl.[6] .................................................. H01L 25/00
[52] U.S. Cl. .......................................... 327/565; 327/566
[58] Field of Search ........................... 307/296.6, 296.1,
307/296.4, 296.5, 296.3, 296.8; 365/196;
326/85, 87; 327/376, 377, 108, 112, 374,
564–566

[56] References Cited

U.S. PATENT DOCUMENTS

| | | | |
|---|---|---|---|
| 4,153,933 | 5/1979 | Blume, Jr. et al. | 364/200 |
| 4,291,404 | 9/1981 | Steiner | 371/20 |
| 4,306,163 | 12/1981 | Blume, Jr. et al. | 307/475 |
| 4,570,154 | 2/1986 | Kinghorn et al. | 340/356 S |
| 4,857,770 | 8/1989 | Partovi et al. | 307/296.1 |
| 4,862,015 | 8/1989 | Grandfield | 307/296.6 |
| 4,866,309 | 9/1989 | Bonke et al. | 326/57 |
| 4,882,506 | 11/1989 | Johansson et al. | 307/296.6 |
| 4,902,915 | 2/1990 | Tran | 307/296.6 |
| 5,068,545 | 11/1991 | Molnar | 327/108 |
| 5,099,153 | 3/1992 | Adams | 307/480 |
| 5,107,142 | 4/1992 | Bhamidipaty | 326/56 |
| 5,151,621 | 9/1992 | Goto | 326/86 |
| 5,306,965 | 4/1994 | Asprey | 327/108 |

FOREIGN PATENT DOCUMENTS

A-0459247A2 12/1991 European Pat. Off. .
58-84330(A) 5/1993 Japan .

*Primary Examiner*—Timothy P. Callahan
*Assistant Examiner*—My-Trang Nu Ton
*Attorney, Agent, or Firm*—Jenkens & Gilchrist

[57] ABSTRACT

A weak pull-up disable method and mechanism therefor for use in association with a microcontroller incorporated in an integrated circuit. The weak pull-up disable mechanism is incorporated in the integrated circuit containing the microcontroller. The mechanism disables the weak pull-ups of I/O buffers of the microcontroller. The weak pull-ups serve to pull the voltage of the associated ports high. By so disabling the weak pull-ups, the need for a driver to sink the current when in input mode is eliminated. Elimination of the need for an external driver due to the weak pull-up disable mechanism reduces power consumption by the integrated circuit.

6 Claims, 2 Drawing Sheets

METHOD AND MECHANISM OF WEAK PULL-UP FOR USE WITH A MICROCONTROLLER IN AN INTEGRATED CIRCUIT

This is a continuation of application Ser. No. 07/917,488, filed Jul. 21, 1992, now abandoned.

CROSS-REFERENCE TO RELATED APPLICATIONS

This application is related to the following U.S. patent applications:

| SER. NO. | TITLE | INVENTOR(S) |
| --- | --- | --- |
| 07/917,497 | General I/O Port Interrupt Mechanism | Gulick, et al. |
| 07/917,489 | Improved External Memory Access Control for a Processing Unit | Gulick, et al. |
| 07/917,503 | Interrupt Mask Disable Circuit and Method | Bowles, et al. |
| 07/918,627 | Integrated Circuit and Cordless Telephone Using the Integrated Circuit | Gulick, et al. |
| 07/918,626 | Modulator Test System | Peterson, et al. |
| 07/918,625 | Keypad Scanner Process and Device and Cordless Telephone Employing the Mechanism | Gulick |
| 07/918,624 | Serial Interface Module and Method | Gulick, et al. |
| 07/918,631 | Low Power Emergency Telephone Mode | Peterson, et al. |
| 07/918,632 | In-Circuit Emulation Capability Mode in Integrated Circuit and Cordless Telephone Using the Integrated Circuit | Gulick, et al. |
| 07/918,622 | Clock Generator Capable of Shut-down Mode and Clock Generation Method | Peterson, et al. |
| 07/918,621 | Signal Averager | Gulick, et al. |

All of the related applications are filed on even date herewith, are assigned to the assignee of the present invention, and are hereby incorporated herein in their entirety by this reference thereto.

The related applications are relevant to this application because all of the applications present inventions that may be incorporated into a CT2 cordless telephone chip. Further, insofar as the separate inventions in each application may interact and cooperate in operation, the inventions are related. Details that may be helpful to those skilled in the art in practicing the present invention, especially in the construction of a CT2 cordless telephone chip, may be found in one or more of the related applications.

BACKGROUND OF THE INVENTION

1. Field of the Invention

The present invention relates to a method for a weak pull-up disable (WPUD) and the mechanism therefor for use in connection with a microcontroller in an integrated circuit (IC) and, more particularly, to such a WPUD method and mechanism for use in connection with a microcontroller in an IC involved with the speech, control channel, or microcontroller portions of a modem, or with the man-machine interface functions of a cordless telephone.

2. Description of Related Art

Heretofore, IC's which incorporate microcontrollers have been developed and used in cordless telephones to perform various functions. There are, however, a number of aspects of IC's in such phones that can be improved. One such aspect includes a WPUD method and mechanism for use in connection with weak pull-ups of microcontroller I/O ports and buffers, which method and mechanism are incorporated in the design of the IC which includes the microcontroller. Such a method and mechanism limits power consumption of external drivers which have heretofore been used to provide for the input capability now provided by the WPUD method and mechanism.

Based upon the foregoing, those skilled in the art should now perceive that a WPUD method and mechanism incorporated in the design of an IC with a microcontroller, for example, an IC for use in cordless telephones, is an improvement over the existing technology. It is a shortcoming and deficiency of the prior art that such an improvement has not previously been conceived.

SUMMARY OF THE INVENTION

To overcome the aforementioned shortcomings and deficiencies, the present invention generally provides a WPUD method and mechanism incorporated in the circuitry of an IC including a microcontroller. More particularly, the present invention provides such a WPUD method and mechanism incorporated in a single IC having a microcontroller, which IC is designed to be installed in both the base unit and handset unit of a cordless telephone and integrates the speech, control channels, and microcontroller portions of a modem, and the man-machine interface functions of a cordless telephone.

BRIEF DESCRIPTION OF THE DRAWINGS

For a more complete understanding of the present invention, and for further objects and advantages thereof, reference may now be had to the following detailed description taken in conjunction with the accompanying drawings wherein.

DETAILED DESCRIPTION OF THE INVENTION

Figure 1B:
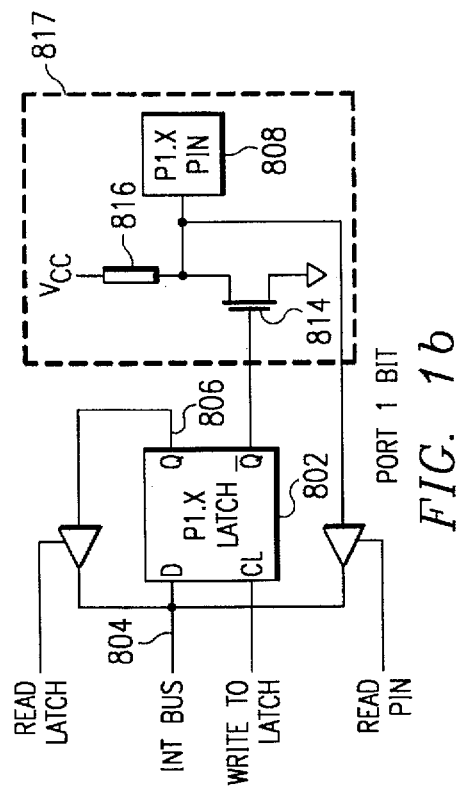
FIG 1b is a second embodiment of a port bit latch and I/O buffer in a microcontroller of the present invention and, in particular, could be related to port 1 of an 8051 microcontroller.
Figure 1D:
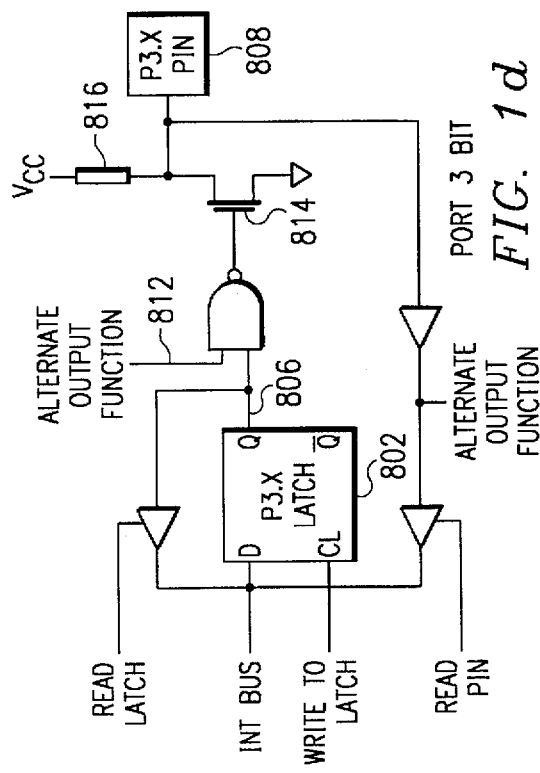
FIG. 1d is a fourth embodiment of a port bit latch and I/O buffer in a microcontroller of the present invention and, in particular, could be related to port 3 of an 8051 microcontroller.
Figure 1A:
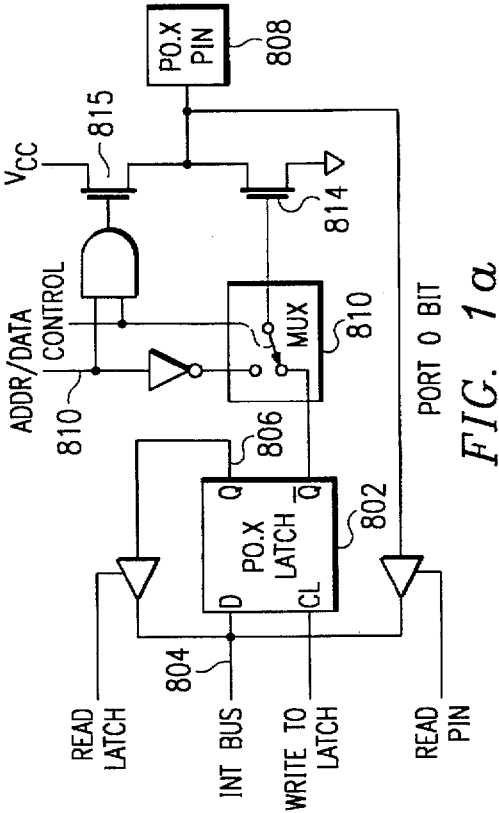
FIG. 1a is a first embodiment of a port bit latch and I/O buffer in a microcontroller of the present invention and, in particular, could be related to port 0 of an 8051 microcontroller.
Figure 1C:
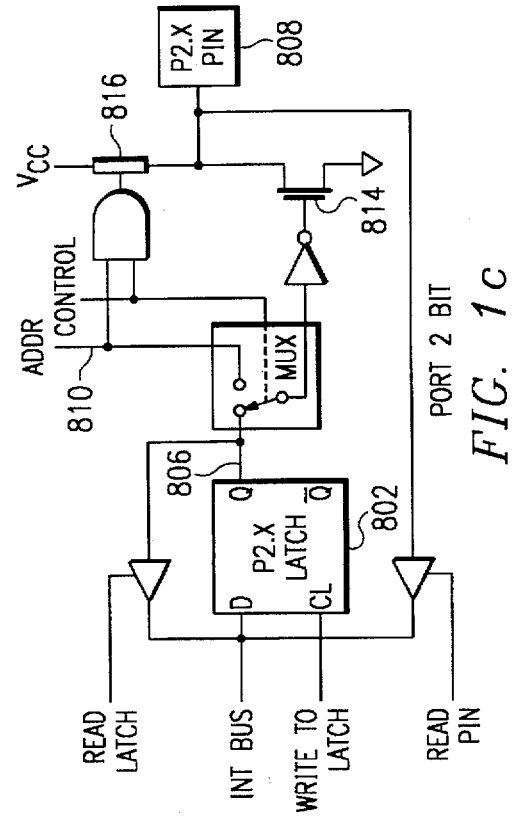
FIG. 1c is a third embodiment of a port bit latch and I/O buffer in a microcontroller of the present invention and, in particular, could be related to port 2 of an 8051 microcontroller.

In the detailed description that follows, to facilitate understanding of the present invention, and as an example only, an embodiment of the WPUD method and mechanism associated with an exemplary microcontroller incorporated into an exemplary IC for use with a cordless telephone system is precisely described. It should be expressly understood that the present invention is not necessarily limited to that application, although the invention has been found to work especially well in actual practice when so used. Further, it should also be expressly understood that a multitude of different embodiments of the present invention could be employed in the particular application described; as is typical and understood, the present invention is limited solely by the scope of the appended claims.

GENERAL DESCRIPTION OF WEAK PULL-UP DISABLE MECHANISM

The WPUD method and mechanism of the present invention are incorporated in the circuitry of an IC. The method and mechanism serve to disable weak pull-ups associated with the buffers of a microcontroller of the IC. Incorporating the method and mechanism into IC circuitry in accordance with the teachings of the present invention eliminates the need for external drivers to sink the current of the weak pull-ups so that the associated ports may serve for input, and therefore results in considerable power savings.

The weak pull-ups serve to cause the buffers of the microcontroller to be maintained at a constant voltage, relative to the source voltage, desired for output mode. In prior practice, an external driver was used to sink the current of the weak pull-ups thereby lowering the voltage of the buffers and enabling the buffers and associated ports to then serve for input when the external drivers were so activated. The external drivers necessary to create this input mode consume power when operating to sink the current of the weak pull-ups. The present invention provides a mechanism for disabling the weak pull-ups (in contrast to merely sinking the current of the weak pull-ups) and thereby enables input to the microcontroller with reduced power consumption.

Certain types of microcontrollers (e.g., the 8-bit microcontrollers providing the functions of the 890C32T2 member of the 80C51 family of AMD products) may contain a weak pull-up on certain of the I/O ports of the microcontrollers. As an example of a microcontroller with pull-ups, the 80C51 family of microcontrollers has internal pull-ups on Ports 1, 2 and 3. Port 0 of such microcontrollers, on the other hand, has open-drain outputs. Each I/O line of the microcontroller can be independently used as an input or an output. (Ports 0 and 2 in the 80C51 family may not, generally, be used as general purpose I/O when being used as the ADDR/DATA BUS). To be used as an input, the port bit latch of this example microcontroller must contain a 1, which turns off the fetch/execute timing (FET) mechanism for the output driver. Then, for Ports 1, 2 and 3, the port pin is pulled high voltage by the internal pull-up. When so configured as inputs, these Ports 1, 2 and 3 pull high voltage and will source current when pulled low voltage. Prior to the present invention, if it was desired that the port pin be pulled low voltage so that the pin could serve for input, an external driver creating a sink for the current was necessary. Such an external driver consumes power when driven to create the sink. The present invention eliminates the need for an external driver to overcome the high pull of the pull-ups and thus reduces power consumption thereof by providing a mechanism which selectively disables the weak pull-up so that, in input mode, the port pin is not pulled high thereby. This WPUD method and mechanism is activated by the particular circuitry of the IC.

In a preferred embodiment of the present invention, the weak pull-ups on the Port 1, 2 and 3 I/O lines of a microcontroller, for example, a microcontroller of the previously mentioned 80C51 family, are disabled by setting the corresponding Port Control Register Bits (PCRB) to appropriate values, for example, as shown in the table below:

| PCRB | PORT | BIT FUNCTION |
| --- | --- | --- |
| 0 | 0 | Drives a "0" output, no pull-up (80C51 compatible) |
| 0 | 1 | Drives a "1" for 2 cycle, weak pull-up is on. (80C51 compatible) |
| 1 | 0 | Drives a "0" output, no pull-up |
| 1 | 1 | Input only, (no pull-up, high impedance input) |

After RESET, the Port 1, 2 and 3 weak pull-ups are enabled. In an IC containing an emulation mode, preferably the weak pull-ups are disabled and the port pins assume a high impedance state during the emulation mode.

Further in a preferred embodiment, the Port 1, 2 and 3 I/O buffers are capable of disabling the weak p-channel pull-up through software control. The necessity of this function permits the buffers to eliminate current sourcing when the buffer is driven low by an external signal. This weak pull-up disabling feature eliminates undesirable power consumption increases. After reset, all of the Port 1, 2, and 3 I/O buffers are held "high" by the weak pull-up. To disable the weak pull-up, the software must first disable each bit by configuring the port pin with the corresponding port control register bit. The corresponding port control register bit resides at the same address as the port Special Function Register (SFR) bit. For example, Port 1 resides at SFR memory location 90H. The Port 1 control register also resides at SFR memory location 90H. Modification of the Port 1 Control Register is only accomplished when the PCRA bit in the PCFIG SFR is set to a "1". When the PCRA bit is cleared, an operation to the Port SFR address results in the Port SFR getting updated.

Since only Ports 1, 2 and 3 contain weak pull-ups, Port 0 is exempt from this feature.

The WPUD method and mechanism is more fully described and understood when considered with respect to an exemplary microcontroller.

THE EXEMPLARY MICROCONTROLLER

An exemplary microcontroller having weak pull-ups associated with the ports and buffers is the 8051 microcontroller. The 8051 is an 8-bit single-chip microcontroller popularly used in power electronic systems. The 8051 is available in three different versions, 8051 being the generic name. The basic 8051 contains 4-kbytes of ROM, 128-bytes of RAM, two 16-bit timer/counters, four programmable 8-bit I/O ports, serial I/O lines, and two external interrupt lines. It also has an on-chip oscillator and clock circuitry which require an externally connected crystal. The 8031 version of the 8051 does not contain any ROM, and the 8751 version contains an EPROM instead of a ROM. The 8052 version contains 8-kbytes of ROM, 256-bytes of RAM, three timers/counters, and six interrupts (two external). An 8032 version of the 8052 exists which is identical to the latter except that it does not have a ROM.

The CPU of the 8051 family can address up to 64-kbytes of program memory of which the lower 4-kbytes may reside on the chip. The data memory may consist of up to 64-kbytes of off-chip RAM, in addition to including 128 bytes of on-chip RAM. The on-chip RAM contains four register banks (each with eight registers), and 128 addressable bit locations. In addition to data RAM, the 8051 contains a 128-byte SFR which helps the CPU in efficient program execution. The SFR contains arithmetic registers, data and stack pointers and registers as latches for I/O ports. The SFR also contains a 128-bit addressable memory. All the I/O ports are bidirectional and have output drivers and input buffers. All 32 lines of the I/O ports have individual READ/WRITE capabilities. The microcontroller has an 8-bit external data bus, and a 16-bit external address bus. Port 0 functions as a multiplexed lower order address and data bus during the access to external program and data memory. Data and address signals can be separated by using the address logic enable (ALE) strobe signal. Port 2 functions as a higher order address byte. Ports 1 and 3 can be used as standard I/O. Port 3 has the special functions of serial I/O, external interrupts, timer inputs and READ/WRITE control of external chips.

Now more specifically addressing the port structures and operation of the 8051, as previously stated, all four ports in the 8051 are bidirectional. Each consists of a latch (SFRs P0 through P3), an output driver, and an input buffer.

The output drivers of Ports 0 and 2, and the input buffers of Port 0, are used in accesses to external memory. In this application, Port 0 outputs the low byte of the external memory address, time-multiplexed with the byte being written or read. Port 2 outputs the high byte of the external memory address when the address is 16 bits wide. Otherwise the Port 2 pins continue to emit the P2 SFR content.

All the Port 3 pins, and (in the 8052) two Port 1 pins are multifunctional. They are not only port pins, but also serve the functions of various special features as listed below:

| Port Pin | Alternate Function |
| --- | --- |
| *P1. 0 | T2 (Timer/Counter 2 external input) |
| *P1. 1 | T2EX (Timer/Counter 2 capture/reload trigger) |
| P3. 0 | RXD (serial input port) |
| P3. 1 | TXD (serial output port) |
| P3. 2 | INT0 (external interrupt) |
| P3. 3 | INT1 (external interrupt) |
| P3. 4 | T0 (Timer/Counter 0 external input |
| P3. 5 | T1 (Timer/Counter 1 external input) |
| P3. 6 | WR (external Data memory write strobe) |
| P3. 7 | RD (external Data memory read strobe) |

*P1. 0 and P1. 1 serve these alternate functions only on the 8052.

The alternate functions can only be activated if the corresponding bit latch in the port SFR contains a 1. Otherwise the port pin is stuck at 0.

Referring now to the drawings wherein for convenience and clarity like or similar elements are generally referred to with the same reference numeral throughout the several views and initially to FIGS. 1a–1d, one sees a functional diagram of a typical bit latch and I/O buffer in each of Ports 0, 1, 2 and 3. The bit latch 802 (one bit in the port's SFR) is represented as a Type D flip-flop, which will clock in a value from the internal bus 804 in response to a "write to latch" signal from the CPU. The Q output of the flip-flop is placed on the internal bus 806 in response to a "read latch" signal from the CPU. The level of the port pin 808 itself is placed on the internal bus in response to a "read pin" signal from the CPU. Some instructions that read a port activate the "read latch" signal, and others activate the "read pin" signal.

As shown in FIGS. 1a–1d, the output drivers (not shown) of Ports 0 and 2 are switchable to an internal ADDR 910 and ADDR/DATA 810 bus by an internal CONTROL signal for use in external memory accesses. During external memory accesses, the P2 SFR remains unchanged, but the P0 SFR gets 1s written to it.

Also shown in FIGS. 1a–1d, is that if a P3 bit latch contains a 1, then the output level is controlled by the signal labeled "alternate output functions" 812. The actual P3. X pin level is always available to the pin's alternate input function, if any.

Figure 2A:
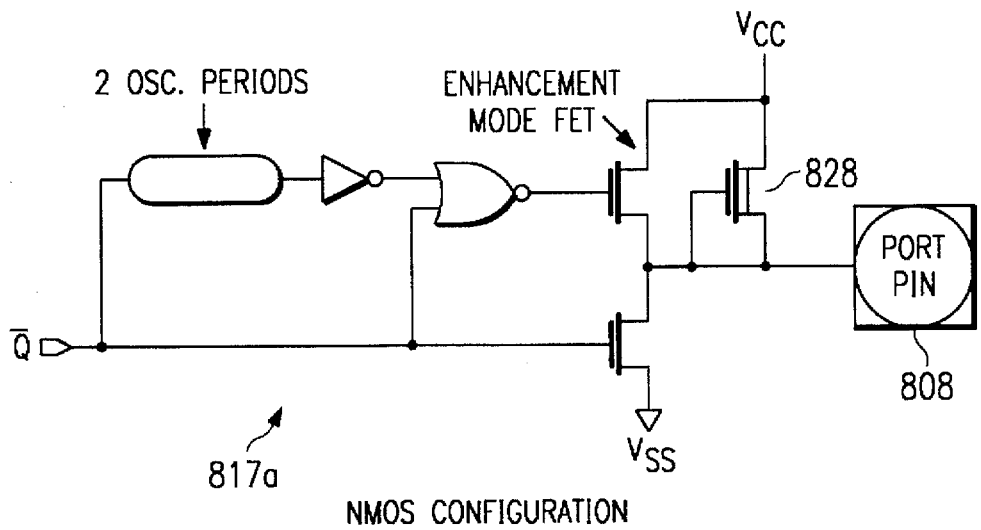
FIG. 2a is an embodiment of the present invention for NMOS internal pull-up configurations and in particular, such an arrangement that could be utilized, for example, in port 1 of an 8051 microcontroller.
Figure 2B:
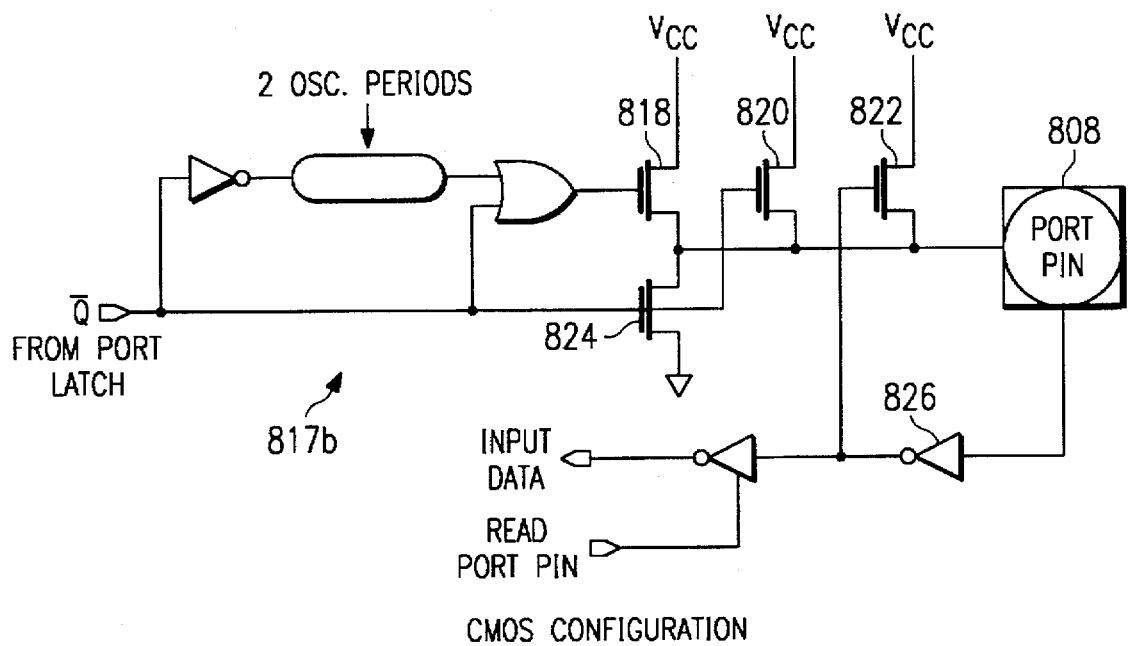
FIG. 2b is an embodiment of the present invention for a CMOS internal pull-up configuration and in particular, such an arrangement that could be utilized in, for example, port 1 of an 8051 microcontroller.

Ports 1, 2 and 3 have internal pull-ups 816 (also shown in detail in FIGS. 2a and 2b). Port 0 has open-drain outputs. Each I/O line can be independently used as an input or an output. (Ports 0 and 2 may not be used as general purpose I/O when being used as the ADDR/DATA BUS.) To be used as an input, the port bit latch must contain a 1, which turns off the output driver FET 814. Then, for Ports 1, 2 and 3, the pin 808 is pulled high by the internal pull-up, but can be pulled low by an external source.

Port 0 differs in not having internal pull-ups. The pull-up FET 814 in the P0 output driver is used only when the port is emitting 1s during external memory accesses. Otherwise the pull-up FET 814 is off. Consequently P0 lines that are being used as output port lines are open drain. Writing a 1 to the bit latch leaves both output FETs 814, 815 off, so the pin floats. In that condition it can be used as a high-impedance input.

Because Ports 1, 2 and 3 have fixed internal pull-ups 816, they are sometimes called "quasi-bidirectional" ports. When configured as inputs they pull high and will source current when externally pulled low. Port 0, on the other hand, is considered "true" bidirectional, because when configured as an input it floats.

All the port latches in the 8051 have 1s written to them by the reset function. If a 0 is subsequently written to a port latch, it can be reconfigured as an input by writing a 1 to it.

Concerning writing to a port, in the execution of an instruction that changes the value in a port latch, the new value arrives at the latch during S6P2 of the final cycle of the instruction. However, port latches are in fact sampled by their output buffers only during Phase 1 of any clock period. (During Phase 2 the output buffer holds the value it saw during the previous Phase 1.) Consequently, the new value in the port latch won't actually appear at the output pin until the next Phase 1, which will be at S1P1 of the next machine cycle.

If the change requires a 0-to-1 transition in Port 1, 2 or 3, an additional pull-up is turned on during S1P1 and S1P2 of the cycle in which the transition occurs. This is done to increase the transition speed. The extra pull-up can source about 100 times the current that the normal pull-up can. It should be noted that the internal pull-ups are field-effect transistors, not linear resistors. The pull-up arrangements are shown in detail in FIGS. 2a and 2b.

Referring now to FIG. 2a, in NMOS versions of the 8051, the fixed part of the pull-up 817a is a depletion-mode transistor with the gate wired to the source. 817a is an exemplary embodiment that can be exchanged for 817 in FIG. 1b. This transistor will allow the pin 808 to source about 0.25 mA when shorted to ground. In parallel with the fixed pull-up is an enhancement-mode transistor, which is activated during S1 whenever the port bit does a 0-to-1 transition. During this interval, if the port pin 808 is shorted to ground, this extra transistor will allow the pin 808 to source an additional 30 mA.

In the CMOS versions, 2b, the pull-up 816 (FIG. 1b) consists of three p-channel FETs (pFET) 818, 820, 822. 817b is an exemplary embodiment that can be exchanged for 817 in FIG. 1b. It should be noted that an n-channel FET (nFET) 824 is turned on when logical 1 is applied to its gate, and is turned off when a logical 0 is applied to its gate. A pFET is the opposite: it is on when its gate sees a 0, and off when its gate sees a 1.

Transistor pFET 1 818 in FIG. 2b is turned on for two oscillator periods after a 0-to-1 transition in the port latch. While it's on, it turns on pFET 3 822 (a weak pull-up) through the inverter 826. This inverter 826 and pFET 3 822 form a latch which holds the 1.

Note that if the pin 808 is emitting a 1, a negative glitch on the pin 808 from some external source can turn off pFET 3 822, causing the pin 808 to go into a float state; pFET 2 820 is a very weak pull-up which is on whenever the nFET 824 is off, in traditional CMOS style. It's only about 1/10 the strength of pFET 3 822. Its function is to restore a 1 to the pin 808 in the event the pin 808 had a 1 and lost it to a glitch.

Regarding port loading and interfacing, the output buffers of Ports 1, 2 and 3 can each drive four LS TTL inputs. The ports on NMOS versions can be driven in a normal manner by any TTL or NMOS circuit. Both NMOS and CMOS pins 808 can be driven by open-collector and open-drain outputs, but note that 0-to-1 transitions will not be fast. In the NMOS device 816a, if the pin 808 is driven by an open-collector output, a 0-to-1 transition will have to be driven by the relatively weak depletion mode FET 828 in FIG. 2a. In the CMOS device, an input 0 turns off pull-up pFET3 822, leaving only the very weak pull-up pFET2 820 to drive the transition.

Referring back to FIG. 1a, Port 0 output buffers can each drive 8 LS TTL inputs. They do, however, require external pull-ups to drive NMOS inputs, except when being used as the ADDRESS/DATA bus.

Boolean processing capability is a special feature of the 8051 microcontroller. In this function, the microcontroller processes bit signals with its own instruction set, its own accumulator and bit addressable internal data RAM and SFR. The 8051 has five hardware activated interrupts, two of which are external. The internal interrupts are generated by timers and the internal serial port. The priority level of interrupts can be predefined. The interrupts can be selectively or globally disabled. The internal timer/counters can be used for measuring pulse widths and time internals, counting events, and causing periodic interrupts. Each counter can be operated in a number of modes.

The 8051 software program can be written in assembly language using an instruction set consisting of 111 instructions. The instructions are divided into functional groups: arithmetic operations, logic operations, data transfer, Boolean variable manipulation, and program machine control. For non-time-critical applications the microcontroller is supported by PL/M language.

Based upon the foregoing, those skilled in the art should now fully understand and appreciate the improvements made by the teachings herein. Those skilled in the art should also fully understand and appreciate the value and merits of the WPUD method and mechanism described herein which may be incorporated in an IC having a microcontroller and, in particular, in such an IC for use in cordless telephones. On virtually every point made herein, however, further details may be found in the related cases listed in the cross-reference to related applications section above. Although those details are not necessary for those skilled in the art to practice the present invention or to comprehend its best mode of practice, those details may be useful to those skilled in the art and they may wish to refer to them.

Obviously, numerous modifications and variations are possible in light of the teachings herein. Accordingly, within the scope of the appended claims, the present invention may be practiced otherwise than as specifically described above.

What is claimed is:

1. An integrated circuit comprising:

a microcontroller having at least one quasi-bidirectional port capable of serving as both an input port and an output port and wherein said at least one quasi-bidirectional port is switchable between being operable as said input port and being operable as said output port in response to a generated signal and, said at least one quasi-bidirectional port including an output buffer with a pull-up element, said pull-up element being of the type having at least two active devices; and means for disabling said pull-up element, said means comprising a latch supplying a re-settable port control bit signal wherein said latch is associated with said quasi-bidirectional port and is operable in response to a setting of a bit corresponding to a predetermined value.

2. The integrated circuit of claim 1, wherein said means for disabling acts as a driver to sink current of said pull-up element.

3. The integrated circuit of claim 1, wherein said means for disabling is activated through, software control.

4. The integrated circuit of claim 1, further comprising a port pin, and wherein said output buffer with said pull-up element is configured with said port pin.

5. A method for reducing power consumption by an integrated circuit incorporating a microcontroller, said microcontroller being of the type having a quasi-bidirectional port, comprising the step of:

disabling a pull-up element having at least two active devices in said quasi-bidirectional port, said quasi-bidirectional port being operable as one of an input port and an output port, wherein said disabling step is effectuated by turning off each of said at least two active devices by applying a signal from a latch, to set a port control bit associated with said quasi-bidirectional port to an appropriate binary value based upon a predetermined bit pattern in said latch.

6. The method of claim 5, further comprising the step of eliminating a driver, said driver for sinking the current of said pull-up element in an input mode.

* * * * *